United States Patent
Oshio (10) Patent No.: US 8,415,870 B2
(45) Date of Patent: Apr. 9, 2013

(54) SEMICONDUCTOR LIGHT EMITTING DEVICE AND BACKLIGHT SOURCE, BACKLIGHT SOURCE SYSTEM, DISPLAY DEVICE AND ELECTRONIC DEVICE USING THE SAME

(75) Inventor: Shozo Oshio, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/001,541

(22) PCT Filed: Aug. 17, 2009

(86) PCT No.: PCT/JP2009/003911
§ 371 (c)(1),
(2), (4) Date: Dec. 27, 2010

(87) PCT Pub. No.: WO2010/023840
PCT Pub. Date: Mar. 4, 2010

(65) Prior Publication Data
US 2011/0102706 A1 May 5, 2011

(30) Foreign Application Priority Data
Aug. 28, 2008 (JP) ................................. 2008-220261

(51) Int. Cl.
*G02F 1/13357* (2006.01)
*G02F 1/1335* (2006.01)
*F21V 9/00* (2006.01)
(52) U.S. Cl. ........... 313/487; 313/486; 313/498; 445/24
(58) Field of Classification Search .......... 313/500–512; 445/24–25
See application file for complete search history.

(56) References Cited

U.S. PATENT DOCUMENTS 6,084,250 A 7/2000 Jüstel et al.
6,469,322 B1 * 10/2002 Srivastava et al. .............. 257/89
(Continued)

FOREIGN PATENT DOCUMENTS

DE 102 33 050 2/2004
EP 1 930 393 6/2008
(Continued)

OTHER PUBLICATIONS

Ohkubo, et al., "Absolute Fluorescent Quantum Efficiency of NBS Phosphor Standard Samples", J. Illum. Engng. Inst. Jpn., vol. 83, No. 2, 1999, pp. 87-93 including an English abstract.

(Continued)

*Primary Examiner* — Tracie Y Green
(74) *Attorney, Agent, or Firm* — Hamre, Schumann, Mueller & Larson, P.C.

(57) ABSTRACT

The semiconductor light emitting device of the present invention emits a blue light component, a green light component, and a red light component. The blue light component is a light component emitted by a first solid light emitting element that emits light having an emission peak in a wavelength range of 430 nm to less than 490 nm, the green light component is light emitted by a second solid light emitting element that emits light having an emission peak in a wavelength range of 360 nm to less than 420 nm that is converted into wavelength-converted light by a green phosphor, and the red light component is light emitted by at least one solid light emitting element selected from the first solid light emitting element and the second solid light emitting element that is converted into wavelength-converted light by a red phosphor. The green phosphor emits green light on the basis of an electronic energy transition of $Mn^{2+}$.

25 Claims, 6 Drawing Sheets

U.S. PATENT DOCUMENTS

| | | |
|---|---|---|
| 6,799,865 B2 | 10/2004 | Ellens et al. |
| 2003/0026096 A1 | 2/2003 | Ellens et al. |
| 2004/0023063 A1 | 2/2004 | Mukai et al. |
| 2004/0207313 A1 | 10/2004 | Omoto et al. |
| 2005/0104076 A1 | 5/2005 | Mueller-Mach et al. |
| 2005/0211992 A1 | 9/2005 | Nomura et al. |
| 2005/0253114 A1 | 11/2005 | Setlur et al. |
| 2006/0083281 A1 | 4/2006 | Inoguchi |
| 2006/0175956 A1 | 8/2006 | Lai |
| 2006/0197098 A1 | 9/2006 | Aihara |
| 2006/0226759 A1 | 10/2006 | Masuda et al. |
| 2006/0255712 A1 | 11/2006 | Masuda et al. |
| 2007/0052342 A1 | 3/2007 | Masuda et al. |
| 2007/0210326 A1 | 9/2007 | Kurihara |
| 2008/0128654 A1* | 6/2008 | Oshio .................... 252/301.4 R |
| 2009/0002604 A1 | 1/2009 | Morimoto |
| 2009/0026920 A1 | 1/2009 | Shimomura et al. |

FOREIGN PATENT DOCUMENTS

| | | |
|---|---|---|
| EP | 1 935 958 | 6/2008 |
| JP | 2000-509912 | 8/2000 |
| JP | 2002-531956 | 9/2002 |
| JP | 2005-285920 | 10/2005 |
| JP | 2005-285925 | 10/2005 |
| JP | 2006-045526 | 2/2006 |
| JP | 2006-049799 | 2/2006 |
| JP | 2006-114854 | 4/2006 |
| JP | 2006-128456 | 5/2006 |
| JP | 2006-245443 | 9/2006 |
| JP | 2006-324653 | 11/2006 |
| JP | 2007-005549 | 1/2007 |
| JP | 2007-049114 | 2/2007 |
| JP | 2007-096133 | 4/2007 |
| JP | 4035394 | 11/2007 |
| JP | 2008-088237 | 4/2008 |
| JP | 2006-216926 | 8/2008 |
| JP | 2008-283155 | 11/2008 |
| WO | 00/33390 | 6/2000 |
| WO | 2005/103199 | 11/2005 |
| WO | 2006/076737 | 7/2006 |

OTHER PUBLICATIONS

Igarashi, et al., "P-106: Phosphors for a White LED to Achieve an LCD with Wide Color Gamut", SID 08 Digest, pp. 1588-1590.

* cited by examiner

SEMICONDUCTOR LIGHT EMITTING DEVICE AND BACKLIGHT SOURCE, BACKLIGHT SOURCE SYSTEM, DISPLAY DEVICE AND ELECTRONIC DEVICE USING THE SAME

TECHNICAL FIELD

The present invention relates to all-solid semiconductor light emitting devices, and backlight sources, backlight source systems, display devices such as a liquid crystal display, and electronic devices using the all-solid light emitting devices.

BACKGROUND ART

Conventionally, there have been known semiconductor light emitting devices (hereinafter referred to as wavelength-converted RGB solid light sources) configured to emit at least light components of the three primary colors, red (R), green (G) and blue (B), with the combined use of solid light emitting elements (e.g., light emitting diodes, hereinafter referred to as LEDs) and phosphors that absorb primary light emitted by the solid light emitting elements and convert the primary light into light with a longer wavelength.

Examples of conventionally-known combination structures of the wavelength-converted RGB solid light sources are as follows.

(1) A combination structure including an ultraviolet LED and red, green and blue phosphors (see Patent document 1, for example)
(2) A combination structure including a blue LED and green and red phosphors (see Patent document 2, for example)
(3) A combination structure including an ultraviolet LED, a blue LED, and red and green phosphors (see Patent document 10, for example)
(4) A combination structure including a blue LED, a green phosphor and a red LED (see Patent document 3, for example)
(5) A combination structure including a blue LED, a green (lime green) phosphor, a green LED and a red phosphor (see Patent document 4, for example)
(6) A combination structure including a blue LED, a green LED and a red phosphor (see Patent document 5, for example)
(7) A combination structure including an ultraviolet LED, blue and green phosphors and a red LED (see Patent document 6, for example)

In addition to the combination structures described above, there also has been invented a combination structure including an LED having light emitting layers that emit two kinds of light with different wavelengths, and phosphors, for example (see Patent document 7, for example).

These conventional semiconductor light emitting devices are created primarily as illumination light sources, and from most of them, each wavelength component is outputted in a state of being adjusted so that light with an arbitrary color temperature or light with a light bulb color, for example, can be emitted (see Patent documents 5 and 8, for example).

Applications of the wavelength-converted RGB solid light sources to backlights for display devices (e.g., backlights for liquid crystal displays) also have been pursued. For example, applications of a combination structure of an ultraviolet LED and red, green and blue phosphors, a combination structure of a blue LED and green and red phosphors, and a combination structure of an ultraviolet/violet LED, a blue LED, and green and red phosphors, etc. have been studied, and liquid crystal displays, etc. using such backlight sources also have been proposed (see Patent documents 9 and 10, for example).

In a wavelength-converted RGB solid light source having the above-described combination structure including an ultraviolet/violet LED, a blue LED, and green and red phosphors, the green phosphor that emits green light and the red phosphor that emits red light both have broadband light absorption properties. This light source is created to solve the problem of an absorption loss of blue light, which occurs due to the blue light not being absorbed entirely but only partially, and high output is achieved particularly by the excitation of a green phosphor activated with $Eu^{2+}$ or a red phosphor activated with $Eu^{2+}$ having an excitation peak in a near-violet-violet wavelength range of 300 to less than 420 nm with excitation light in the region of the excitation peak.

Accordingly, this light source is based on the premise that a phosphor made of $SrAl_2O_4:Eu^{2+}$, $Eu^{2+}$-based thiogallate (e.g., $SrGa_2S_4:Eu^{2+}$) or the like, for example, having an absorption spectrum shifted toward a blue wavelength range and also having broadband light absorption properties in a near-ultraviolet-blue wavelength range [e.g., a phosphor activated with $Eu^{2+}$ that emits green light on the basis of a $(4f)^7$-$(4f)^6 5d^1$ electronic energy transition of $Eu^{2+}$] is used as the green phosphor, not a green phosphor that substantially does not absorb blue light [e.g., a phosphor that emits green light on the basis of a $(3d)^5$-$(3d)^5$ electronic energy transition of $Mn^{2+}$].

Furthermore, a structure in which the above-described green phosphor does not cover a light extraction surface of the blue LED is considered to be a preferred form, and specifically, a structure in which the green phosphor and the red phosphor are at least separated spatially from the blue LED has been proposed.

It should be noted that a highly-precise measurement technique for absolute external quantum efficiency and absolute internal quantum efficiency of phosphors, which will be mentioned in this specification, already has been established and the efficiencies can be evaluated with the use of phosphor samples (see Non-patent document 1, for example).

CITATION LIST

Patent Literature

[PTL 1]
JP 2000-509912 A
[PTL 2]
JP 2002-531956 A
[PTL 3]
JP 2005-285920 A
[PTL 4]
JP 2006-245443 A
[PTL 5]
JP 2006-324653 A
[PTL 6]
JP 2007-5549 A
[PTL 7]
JP 2006-216926 A
[PTL 8]
JP 2005-285925 A
[PTL 9]
JP 2007-96133 A
[PTL 10]
Japanese Patent No. 4,035,394 B
[Non Patent Literature]
[NPL 1]

Kazuaki Okubo et al., "Journal of The Illuminating Engineering Institute of Japan", 1999, Vol. 83, No. 2, p. 87

SUMMARY OF INVENTION

Technical Problem

However, with the conventional wavelength-converted RGB solid light sources, it is generally difficult to obtain highly practical display devices having excellent RGB purity, and both a wider range of color expression and high luminance, all of which are required of liquid crystal displays and liquid crystal televisions.

The root cause of this problem is that high-power solid light emitting elements that emit ultraviolet light are still under development. Hereinafter, this root cause will be described in detail.

In wavelength-converted RGB solid light sources, although solid light emitting elements function as excitation sources for phosphors, the choices for electromagnetic waves emitted by the solid light emitting elements technically are limited to four types; deep-ultraviolet, near-ultraviolet, violet light, and blue light. However, in view of the technical maturity, solid light emitting elements having advantages in both production cost and light output performance are limited to solid light emitting elements that emit blue light. Accordingly, semiconductor light emitting devices that heavily use a blue LED as an excitation source are the only light emitting devices useable as backlight sources that satisfy the market demands.

On the other hand, in white LEDs using a blue LED as a phosphor excitation source, for example, since the energy difference between blue light as excitation light and visible light as wavelength-converted light is relatively small, the number of phosphors that can be excited with a high degree of efficiency is limited due to the physical properties of phosphors.

In the case of green phosphors in particular, due to an extremely small energy difference between light absorption and light emission (the energy difference between blue absorption light and green emission light), green phosphors that satisfy a number of practical conditions are limited only to a few types of phosphors activated with $Eu^{2+}$ or $Ce^{3+}$.

From a phosphor activated with $Eu^{2+}$ and a phosphor activated with $Ce^{3+}$ used selectively as described above, emission light is obtained on the basis of a $(4f)^n\text{-}(4f)^{n-1}5d^1$ electronic energy transition of $Eu^{2+}$ ions or $Ce^{3+}$ ions [n=1($Ce^{3+}$), n=7 ($Eu^{2+}$)]. Thus, their light emission spectrum half-width becomes relatively large due to their light emission mechanisms.

As a result, at least a green light component in output light has a large spectrum half-width of 65 nm or more for a backlight source. Accordingly, it is essentially difficult to increase the color range of the display device.

Particularly, as far as green phosphors activated with $Eu^{2+}$ are concerned, the green phosphors activated with $Eu^{2+}$ generally have an excitation peak in a near-violet-violet wavelength range of 300 nm to less than 420 nm. Therefore, when a blue LED is used as an excitation source for the phosphors, the phosphors cannot be used in a state where their properties are in the best condition. That is, since the phosphors are excited by light having a wavelength shifted toward the long wavelength side from the excitation peak, they cannot exhibit adequate performance. As a result, generally, a green light component in the output light is likely to be poor in light emission efficiency. Thus, when such a green phosphor is used in a semiconductor light emitting device, the luminance of the semiconductor light emitting device tends to be poor.

When the green phosphor activated with $Eu^{2+}$ and the red phosphor activated with $Eu^{2+}$ are excited with a high degree of efficiency by a near-violet or violet LED that emits light having a wavelength of 300 to 420 nm where the phosphors have their excitation peak, the semiconductor light emitting device can achieve high output. However, since the green light component and the red light component have a large spectrum half-width due to the reasons described above, not only does each light become poor in color purity when RGB light components are separated using each of red, green and blue color filters, but also the color range becomes small when images are displayed. Thus, it is difficult to increase the color range of the display device.

On the other hand, efforts have been made to apply a plurality of types of LEDs with significantly different emission light colors (e.g., a combination of a blue LED, a green LED and a red LED, a combination of a blue LED and a green LED, and a combination of a blue LED and a red LED) for reducing the spectrum half-width of each light component of RGB. In this case, however, a circuit configuration for favorably balancing the colors of RGB becomes complicated, and it is difficult to put this configuration to practical use.

This is due to an essential problem that at least two types of solid light emitting elements having light emitting layers of different material systems (e.g., InGaN and GaP, InGaN and AlGaAs, etc.) need to be used in combination in order to obtain, among red, green and blue, at least two emission light colors that are significantly different from each other in color tone.

When a plurality of types of LEDs of different material systems are used, due to their differences in input power-light output properties, it is difficult to maintain a color balance during gradation display, for example. Thus, in order to maintain a desired color balance, the balance needs to be attended by the driver circuit side, thereby complicating the circuit configuration of the backlight source.

Solution to Problem

In order to solve the above-described problems, the present invention provides, with the use of solid light emitting elements having light emitting layers of the same material system, a wavelength-converted RGB solid light source, etc. that emits high-power (high-luminance) RGB light suitable for a liquid crystal backlight, and in particular, a wavelength-converted RGB solid light source, etc. that emits at least a blue light component and a green light component having a small spectral radiation bandwidth and have a wider range of excellent color expression.

The semiconductor light emitting device of the present invention is a semiconductor light emitting device that emits: a blue light component having an emission peak in a wavelength range of 430 nm to less than 490 nm; a green light component having an emission peak in a wavelength range of 500 nm to less than 550 nm, and a red light component having an emission peak in a wavelength range of 600 nm to less than 660 nm. The blue light component is a light component emitted by a first solid light emitting element that emits light having an emission peak in a blue wavelength range of 430 nm to less than 490 nm. The green light component is light emitted by a second solid light emitting element that emits light having an emission peak in a near-ultraviolet-violet wavelength range of 360 nm to less than 420 nm that is converted into wavelength-converted light by a green phosphor. The red light component is light emitted by at least one solid light emitting element selected from the first solid light emitting element and the second solid light emitting element that is converted into wavelength-converted light by a red phosphor. The green phosphor emits green light on the basis of an electronic energy transition of $Mn^{2+}$.

Each of a backlight source and a backlight source system of the present invention includes the semiconductor light emitting device of the present invention.

A display device of the present invention includes the backlight source or the backlight source system of the present invention.

An electronic device of the present invention includes the display device of the present invention.

Advantageous Effects of Invention

According to the present invention, it is possible to provide a highly practical wavelength-converted RGB solid light source, a backlight source, etc. capable of increasing both a color range and luminance of a display device. Further, it is also possible to provide a display device, in particular, a liquid crystal display panel using the wavelength-converted RGB solid light source capable of increasing both a color range and luminance, and an electronic device using the liquid crystal display panel.

DESCRIPTION OF EMBODIMENTS

Hereinafter, embodiments of the present invention will be described with reference to the drawings. However, the present invention is not limited to the following embodiments. In each of the drawings, the same components are denoted by the same reference numerals and overlapping descriptions may not be repeated.

(Embodiment 1)

Figure 6:
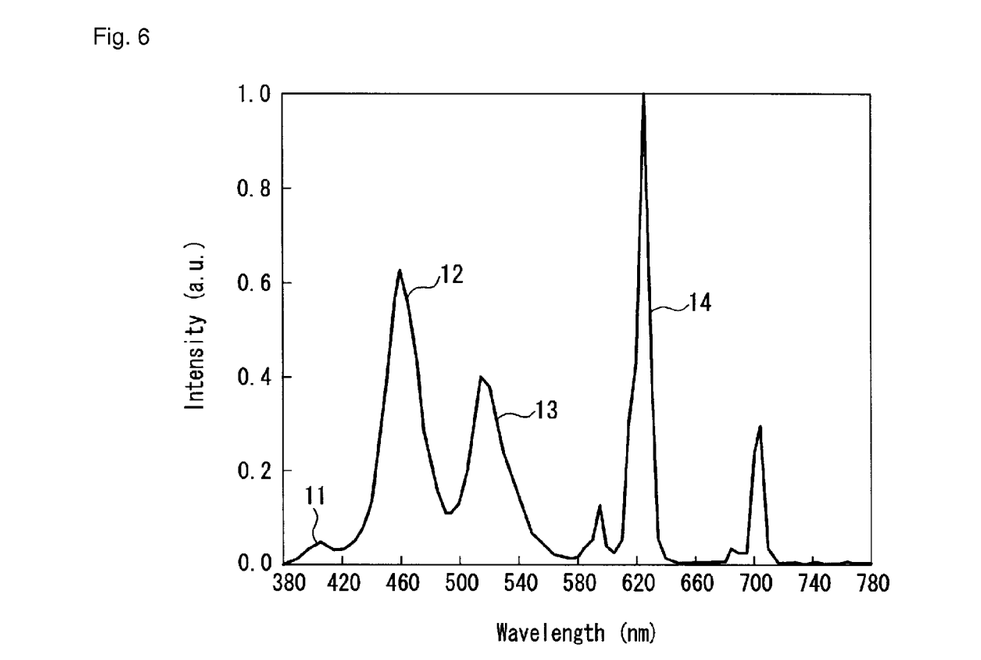
FIG. 6 is a diagram showing one example of a spectral distribution of output light emitted by the semiconductor light emitting device of the present invention.
Figure 7:
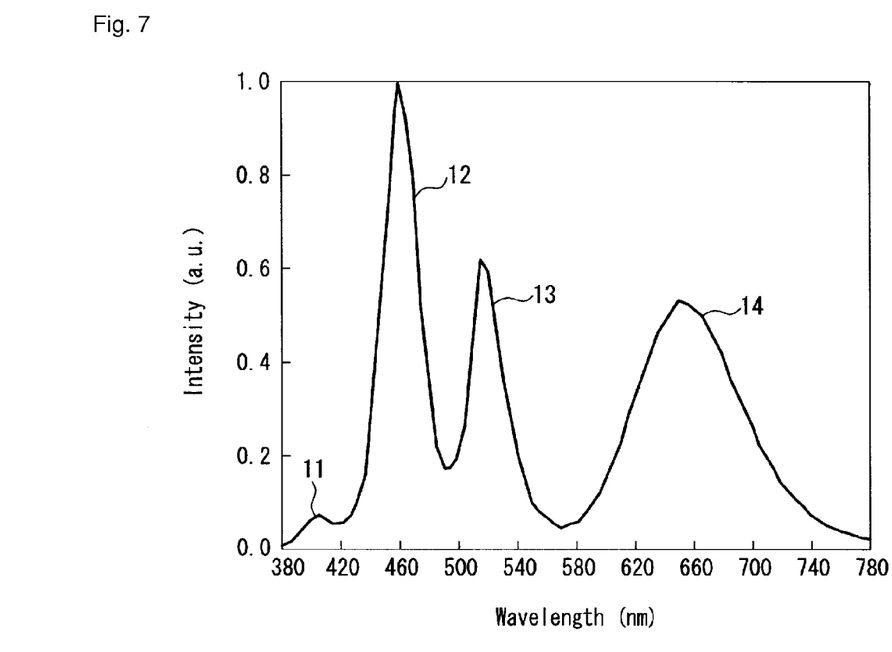
FIG. 7 is a diagram showing one example of a spectral distribution of output light emitted by the semiconductor light emitting device of the present invention.

First, an embodiment of the semiconductor light emitting device of the present invention will be described. FIGS. 1 to 5 are cross-sectional views, each schematically showing one example of the semiconductor light emitting device of the present invention. Although FIGS. 1 to 5 are cross-sectional views, solid light emitting elements 2 and a translucent resin 7 are not denoted with hatching that indicates a cross section, to improve the viewability of the drawings. FIGS. 6 and 7 are diagrams each showing a representative example of spectral distribution of output light emitted by the semiconductor light emitting device of the present invention.

In FIGS. 1 to 5, a substrate 1 is a base to which the solid light emitting elements 2 are fixed, and it is made of, for example, ceramics ($Al_2O_3$, AlN, etc.), metal (Al, Cu, etc.), glass, a resin (silicone resin, filler-containing silicone resin, etc.) or the like.

Further, wiring conductors 3 are provided on the substrate 1. By electrically connecting feeding electrodes 4 of the solid light emitting elements 2 with the wiring conductors 3, power is supplied to the solid light emitting elements 2.

The solid light emitting elements 2 are photoelectric conversion elements that convert electric energy into light energy by a power supply that applies a voltage selected from at least AC, DC, and pulse voltages, and they are, for example, LEDs, laser diodes (LDs), inorganic electroluminescence (EL) elements, or organic EL elements, etc. LEDs or LDs can be used preferably as the solid light emitting elements 2 for obtaining high-power primary light with a small spectrum half-width.

Wavelength conversion layers 5 include a phosphor 6 made of a fluorescent material, and they convert primary light emitted by the solid light emitting elements 2 into light having a longer wavelength than the primary light. The wavelength conversion layers 5 are made of, for example, a resin phosphor film, translucent fluorescent ceramics, fluorescent glass, etc. In the present embodiment, the wavelength conversion layers 5 are formed by a resin phosphor film made by dispersing the phosphor 6 in a translucent resin 7.

The semiconductor light emitting device of the present invention emits, as can be seen from the example of spectral distribution of the output light shown in FIGS. 6 and 7, a blue light component 12 having an emission peak in a wavelength range of 430 nm to less than 490 nm, preferably 440 nm to less than 470 nm, a green light component 13 having an emission peak in a wavelength range of 500 nm to less than 550 nm, and a red color component 14 having an emission peak in a wavelength range of 600 nm to less than 660 nm.

The blue light component 12 is a light component emitted by a first solid light emitting element 2a that emits light having an emission peak in a blue wavelength range of 430 nm to less than 490 nm. The green light component 13 is light emitted by a second solid light emitting element 2b that emits light having an emission peak in a near-ultraviolet-violet wavelength range of 360 nm to less than 420 nm, preferably in a violet wavelength range of 380 nm to less than 410 nm that is converted into wavelength-converted light by a green phosphor 8. The red light component 14 is light emitted by at least one light emitting element selected from the first solid light emitting element 2a and the second light emitting element 2b that is converted into wavelength-converted light by a red phosphor 9 (FIGS. 1 to 5).

The green phosphor 8 emits green light on the basis of an electronic energy transition of $Mn^{2+}$ [$(3d)^5$-$(3d)^5$ electronic energy transition]. Furthermore, it is preferable that the green phosphor 8 is a green phosphor that substantially does not absorb blue light having a wavelength of 450 nm and does not get excited by the blue light.

It is assumed that the phrase "substantially does not absorb blue light having a wavelength of 450 nm and does not get excited by the blue light" refers to a state where absolute external quantum efficiency is less than 10% under excitation by the blue light having a wavelength of 450 nm at ambient temperature. Here, the absolute external quantum efficiency refers to a ratio between the quantum number of excitation light with which the phosphor is irradiated and the quantum number of light emitted by the phosphor, and a method of measuring the absolute external quantum efficiency is described in Non-patent document 1 mentioned above.

In FIGS. 6 and 7, a near-ultraviolet-violet light component 11 is a leakage of primary light emitted by the second solid light emitting element 2b.

In this way, by using the first solid light emitting element 2a that emits light having an emission peak in a blue wavelength range and the second solid light emitting element 2b that emits light having an emission peak in a near-ultraviolet-violet wavelength range in combination, at least the green phosphor 8 is excited not by blue light emitted by the first solid light emitting element 2a but by near-ultraviolet or violet light emitted by the second solid light emitting element 2b. Thus, the energy difference between light absorption and light emission (the energy difference between near-violet-violet absorption light and green emission light) of the green phosphor 8 increases, and as a result, the green phosphor 8 can be selected from a wide range of choices.

Consequently, green phosphors that do not absorb the blue light and substantially do not get excited by the blue light can be used, and phosphors other than green phosphors activated with $Eu^{2+}$, $Ce^{3+}$, etc. can also be used.

Further, in a preferred embodiment of the present invention, since the green phosphor 8 does not absorb blue light having a wavelength in the region of 450 nm and does not get excited by the blue light, blue light emitted by the first solid light emitting element 2a does not interfere with the device. Consequently, it is possible to achieve a semiconductor light emitting device suitable for industrial production that outputs light whose color tone can be adjusted or controlled with relative ease.

Further, by using a phosphor that emits green light on the basis of a $(3d)^5$-$(3d)^5$ electronic energy transition of $Mn^{2+}$ as the green phosphor 8, the spectrum half-width of the green light component 13 becomes less than 60 nm, and as a result, the intensity of a blue-green emission light component in the region of 490 nm and a yellow emission light component in the region of 575 nm becomes small, as shown in FIGS. 6 and 7.

In this way, the energy intensity of both the blue-green light and the yellow light can be reduced to 30% or less, and in a preferred embodiment, 20% or less of the peak of the spectral distribution of the output light, so that not only the boundaries of blue light and green light and green light and red light become clear, but also light output components centered on blue, green and red can be outputted. Thus, without relying heavily on a design technique of color filters, it is possible to separate red, green and blue clearly and to increase a light output that passed through the color filters. As a result, the device configuration becomes suitable for industrial production.

As described above, with the semiconductor light emitting device of the present invention, it is possible to increase the color purity of each light component of RGB and to achieve high output with relative ease. Thus, a wider range of color expression with a high light output can be achieved.

Furthermore, since many of the green phosphors activated with $Mn^{2+}$ emit green light having an emission peak in a deep-green wavelength range of 510 to 520 nm, they can convert light having an emission peak in the near-violet-violet wavelength range into green light with a high degree of photon conversion efficiency (absolute internal quantum efficiency). Thus, the semiconductor light emitting device of the present invention becomes a highly practical semiconductor light emitting device that emits the green light component 13, which is excellent in both the purity of green and light emission efficiency. Here, the photon conversion efficiency (absolute internal quantum efficiency) refers to a ratio between the quantum number of excitation light absorbed by the phosphor and the quantum number of light emitted by the phosphor, and a method of measuring the photon conversion efficiency is described in Non-patent document 1 mentioned above.

It is preferable that the green phosphor 8 that emits green light on the basis of the electronic energy transition of $Mn^{2+}$ is a phosphor coactivated with a combination of $Eu^{2+}$ and $Mn^{2+}$ or a combination of $Ce^{3+}$ and $Mn^{2+}$.

By constructing the green phosphor 8 in this way, $Eu^{2+}$ or $Ce^{3+}$ efficiently absorbs light having a near-violet-violet wavelength range of 360 nm to less than 420 nm emitted by the second solid light emitting element 2b, transfers the light to $Mn^{2+}$, and the absorbed near-violet or violet light is converted into green light with a high degree of photon conversion efficiency close to the theoretical limit.

Further, with the light in a near-violet-violet wavelength range emitted by the second solid light emitting element 2b, green light added with a blue light component (slightly bluish green light) based on an electronic energy transition of $Eu^{2+}$ or $Ce^{3+}$ (a blue light component having a relatively large spectrum half-width) also can be obtained from the green light component 13 by $Mn^{2+}$. Thus, it is possible subtly to control the color tone of the output light with ease.

Furthermore, by constructing the green phosphor 8 in this way, coinciding the peak wavelength of the near-violet-violet light used as the excitation light for the phosphor with the excitation peak wavelength of the green phosphor 8 becomes less necessary. Therefore, even when the peak wavelength of the excitation light shifts toward the long wavelength side relative to the excitation peak of the green phosphor 8, the near-violet or violet light can be converted into green light with photon conversion efficiency close to the theoretical limit. Hence, designing a high-power semiconductor light emitting element device becomes flexible.

For example, even if the green phosphor 8 has an excitation peak in a wavelength range of less than 360 nm and not in a near-violet-violet wavelength range of 360 nm to less than 420 nm, it still has properties capable of converting near-violet-violet light into green light with an extremely high degree of photon conversion efficiency close to the theoretical limit. Thus, it is possible to provide a high-power semiconductor light emitting device.

Further, since most of such phosphors coactivated with $Mn^{2+}$ and at least either $Eu^{2+}$ or $Ce^{3+}$ do not absorb blue light, it is possible to prevent intervention by light in a blue wavelength range emitted by the first solid light emitting element 2a, and the chromaticity of the output light can be controlled with relative ease.

Specific examples of the green phosphor 8 activated with $Mn^{2+}$ as described above include an alkaline earth metal aluminate green phosphor coactivated with $Eu^{2+}$—$Mn^2$ (e.g., $BaMgAl_{10}O_{17}:Eu^{2+},Mn^{2+}$), a rare earth aluminate green phosphor coactivated with $Ce^{2+}$—$Mn^{2+}$ [e.g., $CeMgAl_{11}O_{19}$:$Mn^{2+}$ $Ce(Mg, Zn) Al_{11}O_{19}:Mn^{2+}$], and the like.

In particular, the alkaline earth metal aluminate green phosphor coactivated with $Eu^{2+}$—$Mn^{2+}$ is known as a highly heat resistant phosphor with small temperature extinction, and it is a highly efficient phosphor that has been used practically in high-pressure mercury lamps, and is preferable in terms of increasing the power of the green component 13.

As described above, the phosphor coactivated with $Mn^{2+}$ and at least either $Eu^{2+}$ or $Ce^{3+}$ is preferably a phosphor having not only the green light but also, to a certain extent, a blue output component based on an electronic energy transition of $Eu^{2+}$ or $Ce^{3+}$ in a blue wavelength range of 430 nm to less than 490 nm for controlling the color tone of output light of the semiconductor light emitting device, etc. In this case, in order not to impair the purity of blue due to the spectrum half-width of the blue light component 12 becoming too large, the green phosphor preferably is constructed such that the maximum intensity of the blue light based on an electronic energy transition of $Eu^{2+}$ or $Ce^{3+}$ in the blue wavelength range is about 30% or less, preferably 20% or less of that of the green light so as to limit the maximum intensity of the blue light to a lower value.

Furthermore, according to the present invention, with respect to the first solid light emitting element 2a and the second solid light emitting element 2b, from light emitting elements having an emission peak in a near-violet-violet-blue wavelength range of 360 nm to less than 490 nm, particularly in a violet-blue wavelength range of 380 nm to less than 470 nm, a light emitting element having an emission peak in a near-violet-violet wavelength range may be selected for the second solid light emitting element 2b and a light emitting element having an emission peak in a blue wavelength range may be selected for the first solid light emitting element 2a.

As a result, the materials for the light emitting layers of the first solid light emitting element 2a and the second solid light emitting element 2b can be selected from those of the same material system having relatively similar physical properties. When LEDs are used as the solid light emitting elements 2, they only need to be formed by a compound containing at least Ga and N. More specifically, the light emitting layer of the first solid light emitting element 2a may be formed by an InGaN compound and the light emitting layer of the second light emitting element 2b may be formed by a GaN compound.

Thus, although a plurality of types of LEDs that are slightly different from each other in the compositions of their light emitting layers are used, they are of the same material system and have similar input power-light output properties. Thus, when used for a display device, a color balance can be maintained with relative ease, and the circuit configuration of a backlight source, etc. can be simplified.

According to the present invention, by using the first solid light emitting element 2a that emits light having an emission peak in a blue wavelength range and the second solid light emitting element 2b that emits light having an emission peak in a near-violet-violet wavelength range in combination, the red phosphor 9 only needs to be a phosphor that is excited by at least one light selected from blue light emitted by the first solid light emitting element 2a and near-violet or violet light emitted by the second solid light emitting element 2b. Thus, not only red phosphors that are excited by blue light but also red phosphors that are excited by near-violet light, for which there are a relatively high number of highly-efficient phosphors, also can be used. And not only the green phosphor 8 but also the red phosphor 9 can be selected from a wide range of choices.

As a result, it is possible to use phosphors other than red phosphors activated with $Eu^{2+}$ having a large spectral radiation bandwidth, in particular red phosphors activated with $Eu^{3+}$ having an emission spectrum, considered to be preferable in terms of the purity of red on a display device. Thus, a semiconductor light emitting device that further emits the red light component 14 having excellent color purity and excellent light emission efficiency can be provided.

According to the present invention, the green phosphor 8 only needs to be a highly efficient phosphor with a high degree of absolute internal quantum efficiency (e.g., 80% or more) under excitation by near-violet-violet light emitted by the second solid light emitting element 2b, and it may be a phosphor with a low degree of light emission efficiency whose absolute internal quantum efficiency under excitation by blue light emitted by the first solid light emitting element 2a is less than 50%, in particular less than 10%.

Examples of such a green phosphor 8 include the alkaline earth metal aluminate phosphor coactivated with $Eu^{2+}$—$Mn^{2+}$ (e.g., $BaMgAl_{10}O_{17}:Eu^{2+},Mn^{2+}$) for example, and such a phosphor is used as the green phosphor in the present invention.

In the semiconductor light emitting device of the present invention, it is preferable that the radiation bandwidth of the blue light component 12 is in a range of 20 nm to less than 40 nm and the radiation bandwidth of the green light component 13 is in a range of 20 nm to less than 60 nm. Consequently, not only is it possible that at least the blue light component 12 and the green light component 13 have a small spectral radiation bandwidth and excellent color purity, but also the intensity of blue-green and yellow emission light components can be reduced. Thus, the semiconductor light emitting device of the present invention becomes preferable for a wider range of color expression with high blue and green light outputs.

With respect to such a blue light component 12, primary light emitted by the first solid light emitting element 2a, such as a blue LED, that passed through the wavelength conversion layer 5 may be used partially or entirely in its natural state as the blue light component 12 of the output light.

It should be noted that unlike light emitted by a phosphor, the blue light component 12 emitted by the blue LED is light with strong directivity. Thus, it is preferable that at least primary light emitted by the first solid light emitting element 2a is outputted through a light diffusion layer having a light diffusion effect. Examples of such a light diffusion layer include a translucent sheet or the like on which a particle group, such as an inorganic powder and a resin power, is dispersed. Phosphors (the green phosphor 8 and/or the red phosphor 9) also can be used as the particle group. By configuring in this way, the directivity of the blue light component 12 is relieved and the blue light component 12 is outputted as light that is dispersed in a relatively uniform manner similar to wavelength-converted light emitted by a phosphor. Consequently, white light with suppressed unevenness in its color (color separation) suitable for an illumination light source or a display device can be obtained.

On the other hand, the green light component 13 having such a small spectrum half-width only can be obtained from at least phosphors activated with $Mn^{2+}$ ions based on an electronic energy transition of the $Mn^{2+}$ ions, such as the $BaMgAl_{10}O_{17}:Eu^{2+},Mn^{2+}$ green phosphor, for example.

In the semiconductor light emitting device of the present invention, it is preferable that the light emitting layer of the first solid-light emitting element 2a and the light emitting layer of the second solid light emitting element 2b are both made of a compound containing Ga and N, as described above. Consequently, high-power near-violet-violet and blue primary light can be obtained and a high-power semiconductor light emitting device can be achieved.

Further, in order to achieve both a wider range of color and high luminance, it is preferable that, in the semiconductor light emitting device of the present invention, the red phosphor 9 is at least one of a nitride phosphor or an oxynitride phosphor activated with $Eu^{2+}$ (hereinafter referred to as nitride phosphors) and an oxide phosphor or an oxysulfide phosphor activated with $Eu^{3+}$.

It has been known that such a red phosphor 9 emits light with a high degree of efficiency by near-violet-violet and/or blue light excitation, and its photon conversion efficiency (absolute inner quantum efficiency) is at a level of more than 80%. Therefore, it is possible to provide a semiconductor light emitting device capable of increasing the luminance of a display device.

Examples of the nitride phosphors activated with $Eu^{2+}$ include an alkaline earth metal nitride aluminosilicate phosphor activated with $Eu^{2+}$, an alkaline earth metal nitride silicate phosphor activated with $Eu^{2+}$, an alkaline earth metal oxynitride aluminosilicate phosphor activated with $Eu^{2+}$ and the like, and they are, for example, red phosphors expressed by the following chemical formulas.

$$MAlSiN_3:Eu^{2+} \quad (1)$$

$$M_2Si_5N_8:Eu^{2+} \quad (2)$$

$$M_2Si_{5-x}Al_xN_{8-x}O_x:Eu^{2+} \quad (3)$$

$$MAl_{1+y}Si_{4-y}N_{7-y}O_y:Eu^{2+} \quad (4)$$

where M denotes alkaline earth metal (at least one element selected from Mg, Ca, Sr, and Ba), x satisfies $0<x<2$ or 2, and y satisfies 0, $0<y<1$ or 1.

Since the nitride phosphors activated with $Eu^{2+}$ can be used as the red phosphor 9 that emits light with a high degree of efficiency by near-violet-violet light excitation or blue light excitation, both the first solid light emitting element 2a and the second solid light emitting element 2b of the solid light emitting elements 2 can be used to emit light for exciting the red phosphor 9.

On the other hand, examples of the oxide phosphors or oxysulfide phosphors activated with $Eu^{3+}$ include red phosphors expressed by the following chemical formulas.

$$Ln_2O_2S:Eu^{3+} \quad (1)$$

$$Ln_2O_3:Eu^{3+},Bi^{3+} \quad (2)$$

$$Ln(P,V)O_4:Eu^{3+} \quad (3)$$

$$Ln(P,V)O_4:Eu^{3+},Bi^{3+} \quad (4)$$

where Ln is at least one element selected from Sc, Y, La, Ce and Gd.

Since the oxide phosphor or oxysulfide phosphor activated with $Eu^{3+}$ can be used as the red phosphor 9 that emits light with a high degree of efficiency by near-violet-violet light excitation, the second solid light emitting element 2b can be used, for the solid light emitting elements 2, to emit light for exciting the red phosphor 9.

Examples of combination structures of the first solid light emitting element 2a, the second solid light emitting element 2b and the wavelength conversion layers 5 are as follows. The combination structure of the semiconductor light emitting device of the present invention may be suitably selected from the following combination structures.

Figure 1:
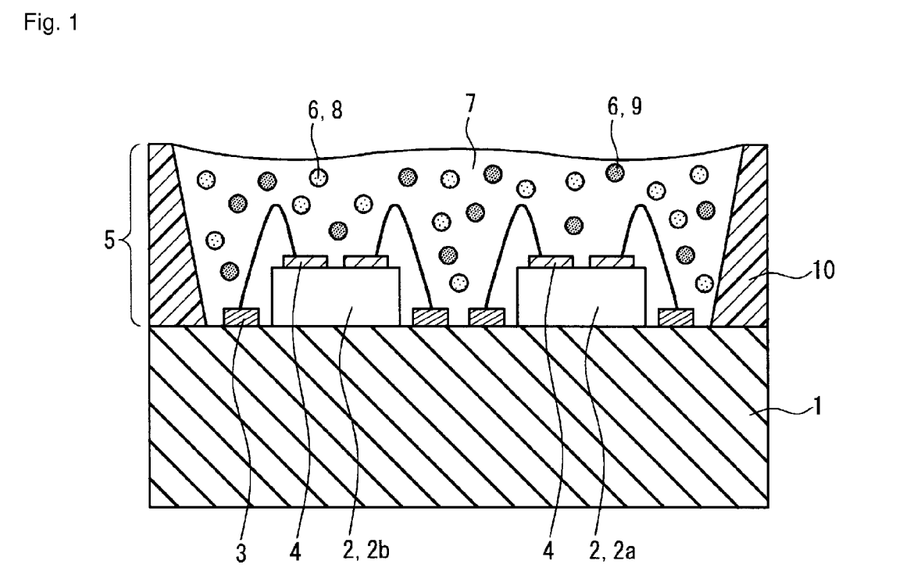
FIG. 1 is a cross-sectional view schematically showing one example of the semiconductor light emitting device of the present invention.
Figure 2:
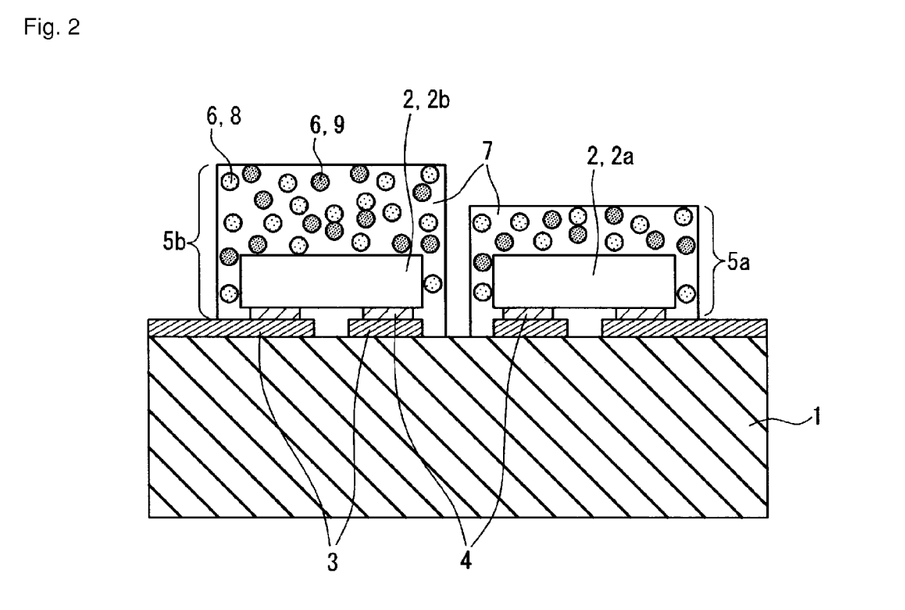
FIG. 2 is a cross-sectional view schematically showing one example of the semiconductor light emitting device of the present invention.

(1) A structure in which the wavelength conversion layers 5 mixed with the green phosphor 8 and the red phosphor 9 are irradiated with primary light emitted by both the first solid light emitting element 2a and the second solid light emitting element 2b (e.g., FIGS. 1 and 2).

Figure 3:
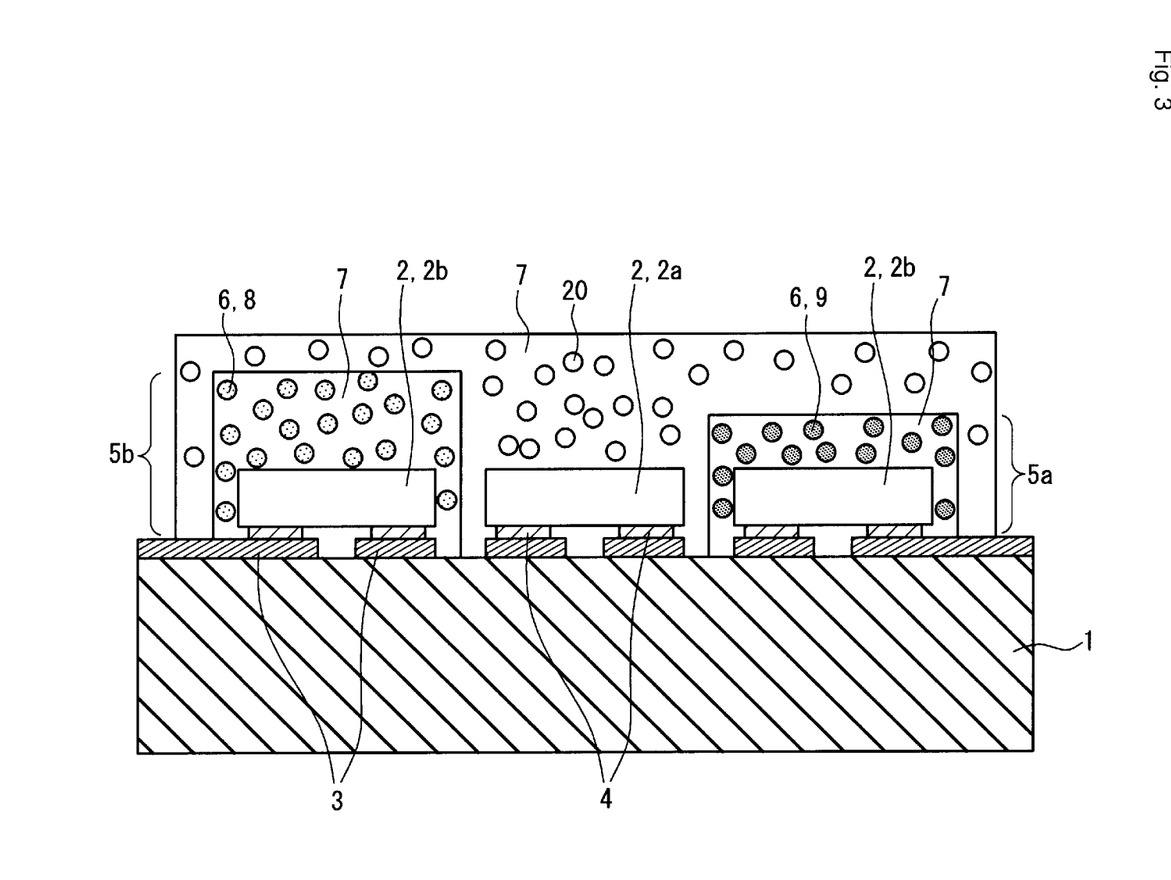
FIG. 3 is a cross-sectional view schematically showing one example of the semiconductor light emitting device of the present invention.

(2) A structure in which primary light emitted by the first solid light emitting element 2a is outputted without illuminating the wavelength conversion layers 5, and a wavelength conversion layer 5a mixed with the red phosphor 9 and a wavelength conversion layer 5b mixed with the green phosphor 8 are irradiated with primary light emitted by the second solid light emitting element 2b (e.g., FIG. 3).

Figure 4:
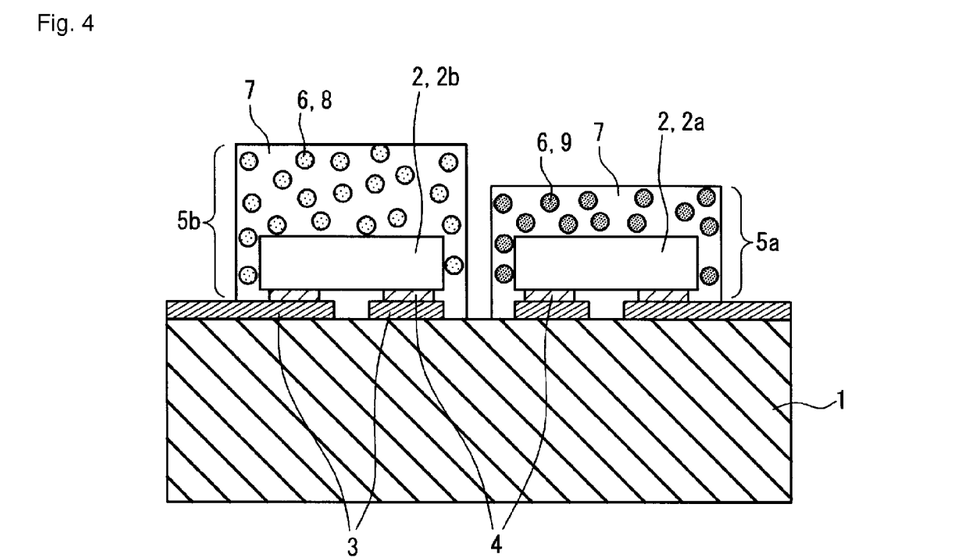
FIG. 4 is a cross-sectional view schematically showing one example of the semiconductor light emitting device of the present invention.

(3) A structure in which the wavelength conversion layer 5a mixed with the red phosphor 9 is irradiated with primary light emitted by the first solid light emitting element 2a and the wavelength conversion layer 5b mixed with the green phosphor 8 is irradiated with primary light emitted by the second solid light emitting element 2b (e.g., FIG. 4).

With the combination structure (1), a semiconductor light emitting device having a simple configuration can be provided. Thus, the production process can be simplified, so that it is possible to provide a semiconductor light emitting device that can be produced at low cost. Further, primary light emitted by both the first solid light emitting element 2a and the second solid light emitting element 2b is diffused by the phosphor particles and its directivity is weakened. Therefore, it is also possible to obtain white light with less unevenness (color separation) in its color.

With the combination structure (2), it is possible to provide a semiconductor light emitting device with suppressed variations in the properties at the production that outputs light whose color can be adjusted with relative ease.

Also with the combination structure (3), it is possible to provide a semiconductor light emitting device with suppressed variations in the properties at the production that outputs light whose color tone can be adjusted with relative ease.

Furthermore, the green phosphor 8 is excited by near-violet-violet light having a relatively small wavelength emitted by the second solid light emitting element 2b and the red phosphor 9 is excited by blue light having a relatively large wavelength emitted by the first solid light emitting element 2a. Thus, in a device structure using two types of solid light emitting elements that emit light with different wavelength, it is possible to minimize the energy difference between light absorption and light emission of each phosphor.

The energy difference between light absorption and light emission (equivalent to an energy loss associated with wavelength conversion) of each phosphor involves an increase in the temperature (heat generation) of the wavelength conversion layers 5, which facilitates the temperature extinction of the phosphors and causes a degradation in the performance of a semiconductor light emitting device. Thus, by having the above configuration, since the second solid light emitting element 2b that emits near-violet-violet light having a small wavelength does not excite at least the red phosphor 9 that emits red light having a large wavelength, the energy difference between light absorption and light emission of the red phosphor 9 can be reduced. Consequently, it is possible to achieve a device structure having an advantage in high output.

In the combination structure (2), as shown in FIG. 3 for example, it is also preferable to dispose a light diffuser 20 (e.g., an inorganic powder, resin particles, etc.) having a light diffusing effect on a light output path for weakening the directivity of light emitted by the first solid light emitting element 2a, when necessary.

In the semiconductor light emitting device of the present invention, it is preferable that the green phosphor 8 covers at least a main light extraction surface of the second solid light emitting element 2b. In a preferred embodiment, the green phosphor 8 does not absorb blue light emitted by the first solid light emitting element 2a and does not get excited by the blue light. Thus, an output from the green phosphor 8 due to near-violet or violet light emitted by the second solid light emitting element 2b can be controlled with relative ease, and it is possible to provide a semiconductor light emitting device that outputs light whose color tone can be controlled with ease. Here, the term "main light extraction surface" refers to a surface of the solid light emitting elements 2 from which 70% or more of the entire output light is emitted and the term also will be used with the same meaning in the following.

In the semiconductor light emitting device of the present invention, as shown in FIG. 4 for example, it is also preferable that the green phosphor 8 covers the main light extraction surface of the second solid light emitting element 2b and the red phosphor 9 covers a main light extraction surface of the first solid light emitting element 2a. Due to this configuration, the output ratio between near-violet-violet light and green light in the output light can be controlled with the second solid light emitting element 2b and the green phosphor 8 and the output ratio between blue light and red light can be controlled with the first solid light emitting element 2a and the red phosphor 9, so that the output ratio between near-violet-violet light and green light and the output ratio between blue light and red light can be controlled separately. Thus, it is possible to provide a semiconductor light emitting device that outputs light whose color tone can be controlled with further ease.

In the semiconductor light emitting device of the present invention, it is also preferable that the green phosphor 8 and the red phosphor 9 both cover the main light extraction surfaces of both the first solid light emitting element 2a and the second solid light emitting element 2b. Due to this configuration, a structurally simple semiconductor light emitting device can be achieved, so that the production process can be simplified. As a result, it is possible to provide a highly practical semiconductor light emitting device that can be produced at low cost.

Figure 5:
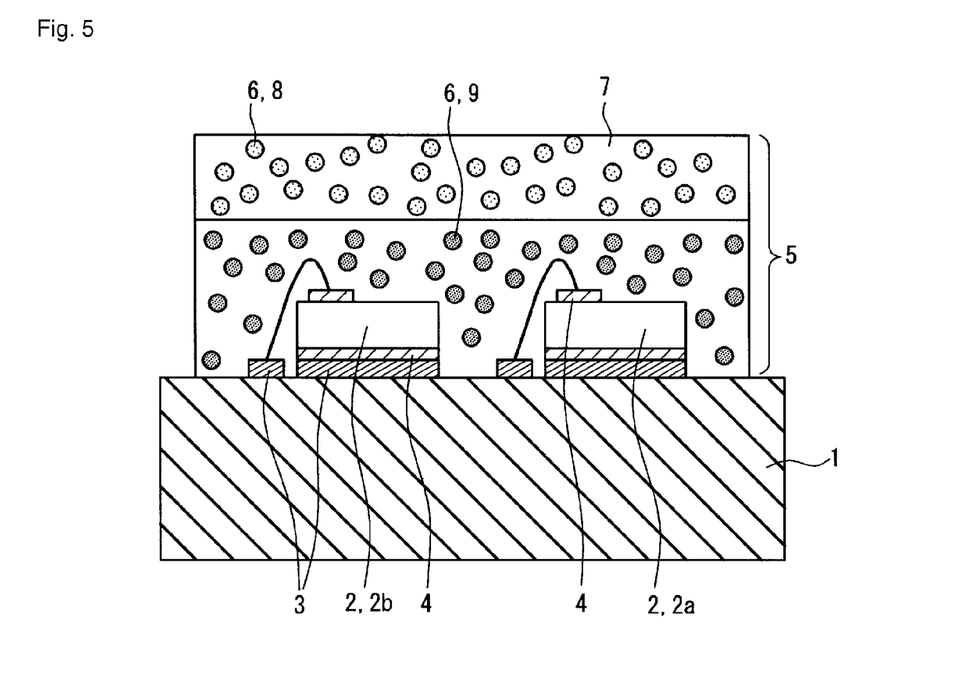
FIG. 5 is a cross-sectional view schematically showing one example of the semiconductor light emitting device of the present invention.

In the semiconductor light emitting device of the present invention, it is preferable that the red phosphor 9 directly covers the main light extraction surfaces of both the first solid light emitting element 2a and the second solid light emitting element 2b, as in the example shown in FIG. 5. Further, it is also preferable that the green phosphor 8 directly covers neither the main light extraction surface of the first solid light emitting element 2a nor the main light extraction surface of the second solid light emitting element 2b, and it is excited by light emitted by the second solid light emitting element 2b that passed through a red phosphor layer containing the red phosphor 9. Due to this configuration, interference between the green phosphor 8 and the red phosphor 9 that occurs when the nitride phosphor activated with $Eu^{2+}$ is used as the red phosphor 9 (mutual interference that occurs due to the red phosphor 9 emitting light by absorbing green light emitted by the green phosphor 8) can be prevented. Consequently, it is possible to provide a semiconductor light emitting device that outputs light whose color tone can be controlled with ease.

FIG. 1 shows a semiconductor light emitting device of a chip type having a structure in which at least the first solid light emitting element 2a and the second solid light emitting element 2b are disposed in a housing 10 and the wavelength conversion layer 5 containing at least the phosphor 6 is provided in the housing 10.

In the configuration shown in FIG. 1, the wavelength conversion layer 5 mixed with the green phosphor 8 and the red phosphor 8 is irradiated with primary light emitted by both the first solid light emitting element 2a and the second solid light emitting element 2b. The present invention, however, is not limited to this configuration and it can have any of the structures (1) to (3) described above.

Each of FIGS. 2 to 4 shows a semiconductor light emitting device having a structure in which at least the first solid light emitting element 2a and the second solid light emitting element 2b are electrically flip-chip mounted on the substrate 1 and one (FIG. 3) or both (FIGS. 2 and 4) of the solid light emitting elements 2 are sealed with resin phosphor films containing at least the phosphor 6 to be the wavelength conversion layers 5.

For example, in FIG. 2, the wavelength conversion layers 5 mixed with the green phosphor 8 and the red phosphor 9 are irradiated with primary light emitted by both the first solid light emitting element 2a and the second solid light emitting element 2b.

For example, in FIG. 3, primary light emitted by the first solid light emitting element 2a is outputted without illuminating the wavelength conversion layers 5, and the wavelength conversion layer 5a mixed with the red phosphor 9 and the wavelength conversion layer 5b mixed with the green phosphor 8 are irradiated with primary light emitted by the second solid light emitting elements 2b.

For example, in FIG. 4, the wavelength conversion layer 5a mixed with the red phosphor 9 is irradiated with primary light emitted by the first solid light emitting element 2a and the wavelength conversion layer 5b mixed with the green phosphor 8 is irradiated with primary light emitted by the second solid light emitting element 2b.

Since visibility is small in the configurations shown in FIGS. 2 and 4, the thickness of the wavelength conversion layer 5b covering the second solid light emitting element 2b is made larger than that of the wavelength conversion layer 5a covering the first solid light emitting element 2a for reducing the percentage of light emitted by the second solid light emitting element 2b in the output, the light of which contributes less to the luminance of the output light. Due to this configuration, since most of light emitted by the second solid light emitting element 2b, which contributes less to the luminance of the output light, can be absorbed by the phosphor 6 contained in the wavelength conversion layer 5b and it is converted into the green light component 13 having high visibility (FIGS. 6 and 7), it is possible to achieve high output.

For achieving high output by absorbing even more light emitted by the second solid light emitting element 2b with the phosphor 6, it is preferable that the light emitted by the second solid light emitting element 2b is absorbed not only by the green phosphor 8 but also by the red phosphor 9.

Further, in the configuration shown in FIG. 3, the number of the second solid light emitting elements 2b is made larger than that of the first solid light emitting element 2a so that photons forming each of the blue light component 12, the green light component 13, and the red light component 14 are well balanced. Furthermore, the green light component 13 and the red light component 14 are wavelength-converted light of light respectively emitted by the different solid light emitting elements 2, so that the blue light component 12, the green light component 13 and the red light component 14 can be controlled independently, and the color tone can be controlled with further ease.

The present invention has a structure as described above. By energizing the first solid light emitting element 2a and the second solid light emitting element 2b to emit light having an emission peak in a blue wavelength range of 430 nm to less than 490 nm from the first solid light emitting element 2a and light having an emission peak in a near-violet-violet wavelength range of 360 nm to less than 420 nm from the second solid light emitting element 2b and utilizing the wavelength conversion layers 5 containing at least the phosphor 6, a semiconductor light emitting device that emits the blue light component 12, the green light component 13 and the red light component 14 can be achieved.

Furthermore, the blue light component 12 is a light component emitted by the first solid light emitting element 2a, the green light component 13 is light emitted by the second solid light emitting element 2b being converted into wavelength-converted light by the green phosphor, and the red light component 14 is light emitted by at least one solid light emitting element selected from the first solid light emitting element 2a and the second solid light emitting element 2b being converted into wavelength-converted light by the red phosphor.

Consequently, a semiconductor light emitting device including at least the blue light component 12 having a small spectrum half-width, the green light component 13 having a small spectrum half-width, and the red light component 14 that emits highly-efficient white output light can be configured using solid light emitting elements that include light emitting layers of the same material system. Thus, it is possible to provide a semiconductor light emitting device that emits highly-efficient white light suitable for a wider range of color expression.

As can be seen from FIGS. 6 and 7, with respect to the spectral distribution of the white light emitted by such a semiconductor light emitting device, the percentage of output intensity of at least blue-green of 490 nm and yellow of 575 nm is, in a preferred embodiment, 30% or less, and in a more preferred embodiment, 20% or less of the peak of the spectral distribution of the output light.

As a result, the spectral distribution of the white light becomes such that the light is centered on blue, green and red, and when the light is combined with color filters through which blue, green and red light passes, not only is the percentage of the light components lost due to being absorbed by the color filters reduced and high output can be achieved, but also blue, green and red output light excellent in color purity can be obtained. Thus, a wide ranger of color expression can be achieved.

Further, in a preferred embodiment, most of near-violet-violet light can be absorbed by the phosphors and its wavelength can be converted by means of increasing the thickness of the resin phosphor film or increasing the concentration of the phosphors in the translucent resin that forms the resin phosphor film. Thus, similarly to blue-green and yellow light components, the percentage of output intensity of the near-violet-violet light component 11 can be reduced to 30% or less, preferably 20% or less, and more preferably 10% or less of the peak of spectral distribution of the output light, and thereby high output can be achieved.

As the example shown in each of FIGS. 2 to 4 illustrates, with the device configuration in which the wavelength conversion layers 5a and 5b irradiated with light emitted by the first solid light emitting element 2a and/or the second solid light emitting element 2b are spatially separated, the color tone of the output light can be controlled with ease, and this configuration is preferable in terms of reducing the percentage of light emitted by the second solid light emitting element 2b (the source of the near-violet-violet light component 11) in the output, for example.

As described above, with the semiconductor light emitting device of the present invention, it is possible to achieve a wider range of color expression by clearly separating RGB to increase the color purity of each light component of RGB.

(Embodiment 2)

Next, embodiments of the backlight source and the backlight source system of the present invention will be described.

Figure 8:
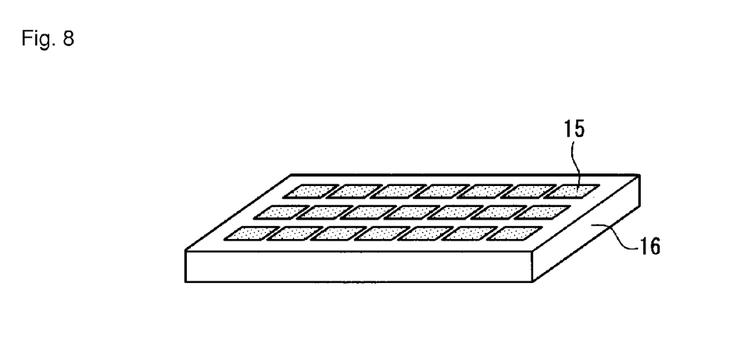
FIG. 8 is a schematic view showing one example of the backlight source of the present invention.

FIG. 8 is a perspective view schematically showing one example of the backlight source of the present invention, and the example illustrates an illumination module 16 including a plurality of light emitting portions 15, each using output light of the semiconductor light emitting device according to Embodiment 1.

The backlight source of the present invention includes at least one semiconductor light emitting device according to Embodiment 1 whose examples are shown in FIGS. 1 to 5, and utilizes output light emitted by the semiconductor light emitting device according to Embodiment 1 as light emitted by each of the light emitting portions 15.

Figure 9:
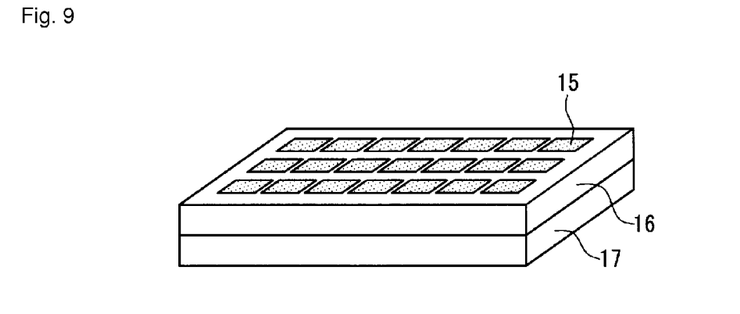
FIG. 9 is a schematic view showing one example of the backlight source system of the present invention.

Further, FIG. 9 is a schematic view showing one example of the backlight source system of the present invention that uses the semiconductor light emitting devices according to Embodiment 1 whose examples are shown in FIGS. 1 to 5. The backlight source system according to the present invention is typically a light source system configured to emit the above-described white light suitable for a wider range of color expression by adding an illumination circuit system 17 to the backlight source of the present invention shown in FIG. 8.

The effects and the like obtainable from the backlight source and the backlight source system having the configuration as described above are similar to those obtainable from the semiconductor light emitting device according to Embodiment 1.

(Embodiment 3)

Figure 10:
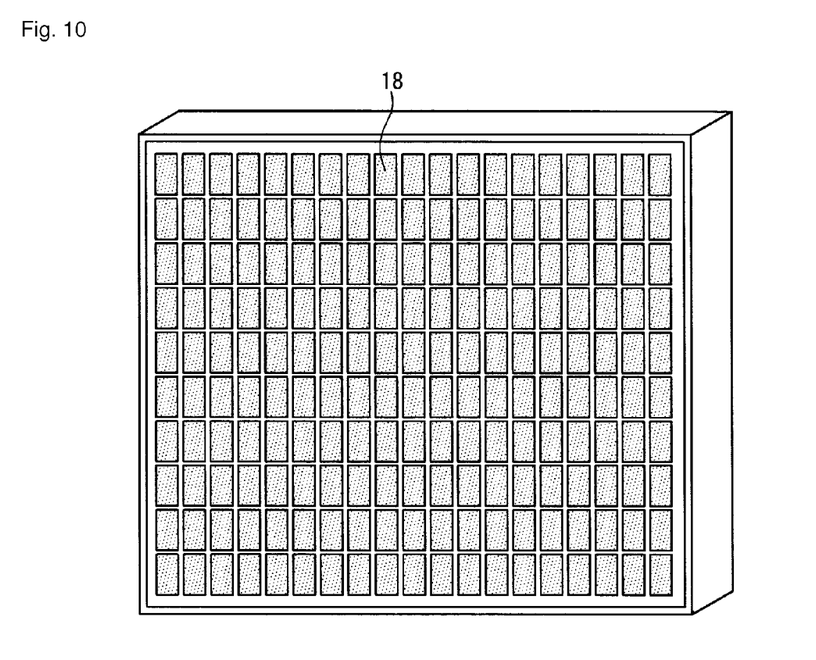
FIG. 10 is a schematic view showing one example of the display device of the present invention.

FIG. 10 is a perspective view schematically showing one example of the display device of the present invention in which the backlight source or the backlight source system according to Embodiment 2 schematically shown in FIGS. 8 and 9 is incorporated. The example illustrates a flat display device including display pixels 18.

A representative example of the display device is a liquid crystal display panel, and it can be formed by combining at least the backlight source according to Embodiment 2, optical modulators, and color filters.

The display device of the present invention uses the backlight source or the backlight source system according to Embodiment 2, and a liquid crystal display panel as one example thereof can be used in a wide range of electronic devices, such as a mobile phone, a handy-type camcorder, a compact game machine, and a liquid crystal television.

Since the backlight source or the backlight source system according to Embodiment 2 uses the semiconductor light emitting device according to Embodiment 1, it is possible to provide a display device including at least the blue light component 12 having a small spectrum half-width, the green light component 13 having a small spectrum half-width and the red light component 14 (FIGS. 6 and 7) that emits highly-efficient RGB light.

Further, since the first solid light emitting element 2a and the second solid light emitting element 2b can include light emitting layers of the same material system, the above-described color balance can be maintained with relative ease and also there is a less necessity for complicating driver circuits.

Due to a synergy between these effects, it is possible to provide a highly practical display device, in particular, a liquid crystal display panel having both a wider range of color expression and high luminance.

Since such a liquid crystal display panel has good visibility even in the outdoors where outside light is strong, it is suitable for being applied to a variety of electronic devices usable in the outdoors.

(Embodiment 4)

Figure 11:
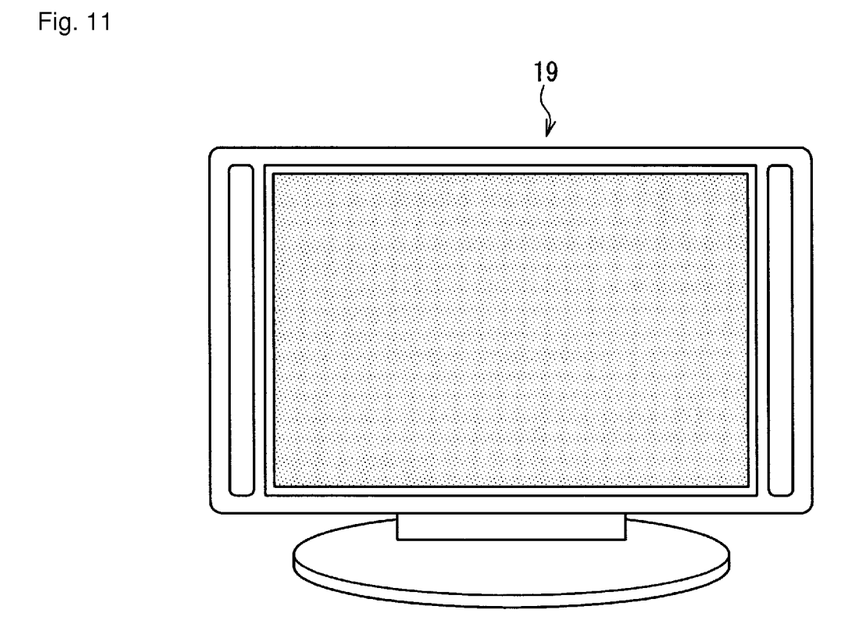
FIG. 11 is a schematic view showing one example of a liquid crystal television set as a representative example of the electronic device of the present invention.

FIG. 11 is a schematic view showing one example of a liquid crystal television as a representative example of the electronic device of the present invention, and the television uses the display device according to Embodiment 3.

A liquid crystal television 19 shown in FIG. 11 is a liquid crystal television with which broadcasts can be enjoyed in both video and audio by adding a broadcast receiver, an audio system, and the like to the display device (liquid crystal display panel) of the present invention shown in FIG. 10.

Since the liquid crystal television according to Embodiment 4 is assembled using the liquid crystal display panel having both a wide ranger of color expression and high luminance, it is a television device having excellent image display performance. Further, since the liquid crystal display panel has both a wider range of color expression and high luminance and also is compatible with outdoor light in nature, a television device with excellent contrast performance can be designed with relative ease. Therefore, a high-contrast liquid crystal television also can be provided.

Since the display device of the present invention has excellent visibility even in the outdoors where outside light is strong, effects similar to those obtained from the display device can be obtained from the electronic device of the present invention equipped with the liquid crystal display panel. These effects can be exerted remarkably by the electronic device of the present invention equipped with the liquid crystal display panel when it is designed to be useable also in the outdoors.

The invention may be embodied in other forms without departing from the sprit of essential characteristics thereof. The embodiments disclosed in this application are to be considered in all respects as illustrative and not limiting. The scope of the invention is indicated by the appended claims rather than by the foregoing description, and all changes that come within the meaning and range of equivalency of the claims are intended to be embraced therein.

[Industrial Applicability]

As described above, according to the present invention, it is possible to provide a semiconductor light emitting device suitable for a display device, having both a wider range of color expression and high luminance, a backlight source, a backlight source system, a display device, and the like with relative ease. Thus, the present invention has a great practical value.

REFERENCE SIGNS LIST 1 substrate
2 solid light emitting element
2a first solid light emitting element
2b second solid light emitting element
3 wiring conductor
4 feeding electrode
5, 5a, 5b wavelength conversion layer
6 phosphor
7 translucent resin
8 green phosphor
9 red phosphor
10 housing
11 near-ultraviolet-violet light component
12 blue light component
13 green light component
14 red light component
15 light emitting portion
16 illumination module
17 illumination circuit system
18 display pixel
19 liquid crystal television
20 light diffuser

The invention claimed is:

1. A semiconductor light emitting device that emits:
a blue light component having an emission peak in a wavelength range of 430 nm to less than 490 nm,
a green light component having an emission peak in a wavelength range of 500 nm to less than 550 nm,
a red light component having an emission peak in a wavelength range of 600 nm to less than 660 nm,
wherein the blue light component is a light component emitted by a first solid light emitting element that emits light having an emission peak in a blue wavelength range of 430 nm to less than 490 nm,
the green light component is light emitted by a second solid light emitting element that emits light having an emission peak in a near-ultraviolet-violet wavelength range of 360 nm to less than 420 nm that is converted into wavelength-converted light by a green phosphor,
the red light component is light emitted by at least one solid light emitting element selected from the first solid light emitting element and the second solid light emitting element that is converted into wavelength-converted light by a red phosphor,
the green phosphor emits green light on the basis of an electronic energy transition of $Mn^{2+}$
the green light component has a spectrum half-width of 20 nm or more and less than 60 nm, and
of output light emitted by the semiconductor light emitting device, each of blue-green light having a wavelength of 490 nm and yellow light having a wavelength of 575 nm has an energy intensity that is 20% or less of a peak of a spectral distribution of the output light.

2. The semiconductor light emitting device according to claim 1, wherein the green phosphor is a green phosphor that substantially does not absorb blue light having a wavelength of 450 nm and does not get excited by the blue light.

3. The semiconductor light emitting device according to claim 1, wherein the green phosphor is a phosphor coactivated with a combination of $Eu^{2+}$ and $Mn^{2+}$ or a combination of $Ce^{3+}$ and $Mn^{2+}$.

4. The semiconductor light emitting device according to claim 3, wherein the green phosphor has an excitation peak in a wavelength range of less than 360 nm and does not have an excitation peak in a near-violet-violet wavelength range of 360 nm to less than 420 nm.

5. The semiconductor light emitting device according to claim 1, wherein the green phosphor is an alkaline earth metal aluminate green phosphor coactivated with $Eu^{2+}$—$Mn^{2+}$.

6. The semiconductor light emitting device according to claim 5, wherein the alkaline earth metal aluminate green phosphor coactivated with $Eu^{2+}$—$Mn^{2+}$ is expressed by a composition formula of $BaMgAl_{10}O_{17}$:$Eu^{2+}$,$Mn^{2+}$.

7. The semiconductor light emitting device according to claim 1, wherein the green phosphor is a rare earth aluminate green phosphor coactivated with $Ce^{3+}$—$Mn^{2+}$.

8. The semiconductor light emitting device according to claim 7, wherein the rare earth aluminate green phosphor coactivated with $Ce^{3+}$—$Mn^{2+}$ is expressed by a composition formula of $CeMgAl_{11}O_{19}$:$Mn^{2+}$ or $Ce(Mg,Zn)Al_{11}O_{19}$:$Mn^{2+}$.

9. The semiconductor light emitting device according to claim 1, wherein a light emitting layer of the first solid light emitting element and a light emitting layer of the second solid light emitting element both are made of a composition containing Ga and N.

10. The semiconductor light emitting device according to claim 1, wherein the red phosphor is a nitride phosphor or an oxynitride phosphor activated with $Eu^{2+}$.

11. The semiconductor light emitting device according to claim 1, wherein the red phosphor is an oxide phosphor or an oxysulfide phosphor activated with $Eu^{3+}$.

12. The semiconductor light emitting device according to claim 1, wherein the green phosphor covers at least a main light extraction surface of the second solid light emitting element.

13. The semiconductor light emitting device according to claim 1, wherein the green phosphor covers a main light extraction surface of the second solid light emitting element and the red phosphor covers a main light extraction surface of the first solid light emitting element.

14. The semiconductor light emitting device according to claim 1, wherein the green phosphor and the red phosphor both cover main light extraction surfaces of both the first solid light emitting element and the second solid light emitting element.

15. The semiconductor light emitting device according to claim 1,
wherein the red phosphor covers main light extraction surfaces of both the first solid light emitting element and the second solid light emitting element,
the green phosphor covers neither the main light extraction surface of the first solid light emitting element nor the main light extraction surface of the second solid light emitting element, and the green phosphor is excited by light emitted by the second solid light emitting element that passed through a red phosphor layer containing the red phosphor.

16. A backlight source comprising the semiconductor light emitting device according to claim 1.

17. A backlight source system comprising the semiconductor light emitting device according to claim 1.

18. A display device comprising the backlight source according to claim 16.

19. An electronic device comprising the display device according to claim 18.

20. The electronic device according to claim 19, wherein the display device is a liquid crystal display panel.

21. The semiconductor light emitting device according to claim 2, wherein the green phosphor is a phosphor coactivated with a combination of $Eu^{2+}$ and $Mn^{2+}$ or a combination of $Ce^{3+}$ and $Mn^{2+}$.

22. The semiconductor light emitting device according to claim 21, wherein the green phosphor has an excitation peak in a wavelength range of less than 360 nm and does not have an excitation peak in a near-violet-violet wavelength range of 360 nm to less than 420 nm.

23. A display device comprising the backlight source system according to claim 17.

24. An electronic device comprising the display device according to claim 23.

25. The electronic device according to claim 24, wherein the display device is a liquid crystal display panel.

* * * * *

UNITED STATES PATENT AND TRADEMARK OFFICE
CERTIFICATE OF CORRECTION

PATENT NO. : 8,415,870 B2  
APPLICATION NO. : 13/001541  
DATED : April 9, 2013  
INVENTOR(S) : Oshio Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 197 days.

Signed and Sealed this
Nineteenth Day of November, 2013

Teresa Stanek Rea
*Deputy Director of the United States Patent and Trademark Office*